United States Patent [19]

Fiege

[11] 4,007,403
[45] Feb. 8, 1977

[54] CIRCUIT CARD GUIDE
[76] Inventor: L. Gail Fiege, c/o Trio Metal Co., Falls & Clarkview Roads, Baltimore, Md. 21209
[22] Filed: Dec. 15, 1975
[21] Appl. No.: 640,709
[52] U.S. Cl. .......................... 317/101 DH; 211/41
[51] Int. Cl.² ........................................ H02B 1/02
[58] Field of Search ............... 317/101 DH; 211/41
[56] References Cited
UNITED STATES PATENTS 3,395,318  7/1968  Laermer et al. ............ 317/101 DH
3,563,391  2/1971  Weltha et al. .............. 317/101 DH Primary Examiner—David Smith, Jr.
Attorney, Agent, or Firm—Gardiner, Sixbey, Bradford & Carlson

[57] ABSTRACT

A circuit card guide comprising an elongated channel shaped element having upstanding side walls, each with an upper reach extending inwardly in a reentrant bend and terminating in a downwardly extending lip. The reentrant bend includes portions cut away to leave a contiguous lip portion which is deformed inwardly of the guide to form a resilient leaf spring for engagement with a circuit card.

8 Claims, 5 Drawing Figures 4,007,403

CIRCUIT CARD GUIDE

BACKGROUND OF INVENTION

This invention constitutes an improvement in circuit card guides of the type exemplified by my prior U.S. Pat. No. 3,258,650, issued June 28, 1966. That patent discloses a circuit card guide comprising a channel shaped element wherein the side walls extend inwardly to terminate in edges spaced from one another sufficiently to permit entry of a circuit card therebetween while exerting resilient clamping pressure against the card throughout the length of the guide.

Other circuit card guides have been constructed so as to exert the resilient clamping force only at spaced points along the guide. For instance, Calabro U.S. Pat. No. 3,231,785, issued Jan. 25, 1966 discloses a circuit card guide comprising an elongated channel shaped element including spaced pairs of opposed fingers extending from the side walls in cantelever fashion, the free end portions providing the gripping contact with the circuit card.

Opposed pairs of cantilevered gripping fingers are also seen in a circuit card guide manufactured by Scanbe Manufacturing Corporation of Monterey Park, Cal. and identified as Guide No. 10067.

In each of the foregoing, the cantilever structure is subject to breakage or distortion under conditions of abuse in handling or in circuit card insertion. Moreover, the gripping fingers are formed by an interruption in the side wall with a consequent sacrifice of structural integrity.

The shortcoming inherent in cantilevered gripping elements has been avoided by structures wherein the gripping element is supported at both ends in order to form a leaf spring, the element being displaced inwardly toward the circuit card to resiliently press thereagainst. One such structure is seen in International Business Machines, Inc., Technical Disclosure Bulletin, Vol. 17, No. 1, June, 1974, page 128. This structure comprises an elongate channel member having the edges of the base portion and the basal region of the side walls cut away at the juncture thereof, all three walls being displaced inwardly of the channel to provide three resilient gripping members. The walls are resilient throughout virtually their entire length, being absent any reinforcing provision in the side walls.

Another similar guide is the subject of British patent No. 1,109,701 published Apr. 10, 1968 to McMurdo Instrument Company Limited. This patent describes a circuit card guide including a channel having one or more webs, each formed integrally of the guide and being attached to a wall of the channel only at its ends and being free of attachment intermediate its ends, the intermediate free portion extending into the channel and being resilient so as to grip a card inserted in the channel. The resilient gripping elements are formed by a slot extending downwardly from the upper surface of the sidewall of substantial thickness.

OBJECTS OF INVENTION

In contradistinction to the foregoing, it is among the objects of this invention to provide a circuit card guide wherein:
1. the guide is of light weight, one piece construction,
2. the guide provides integral resilient card gripping elements supported at both ends,
3. the gripping elements are formed from the sidewall structure without significant sacrifice of sidewall integrity,
4. the sidewalls are provided with integral reinforcing structure which serves to define the circuit card receiving track, and
5. the gripping elements are integral with the sidewall structure at both ends of the element so as to provide adequate support to avoid breakage or distortion thereof.

DESCRIPTION OF DRAWINGS

These, and other self-evident advantages of this invention may be better understood by a consideration of the ensuing specification and accompanying drawings, in which.

DESCRIPTION OF INVENTION

Figure 1:
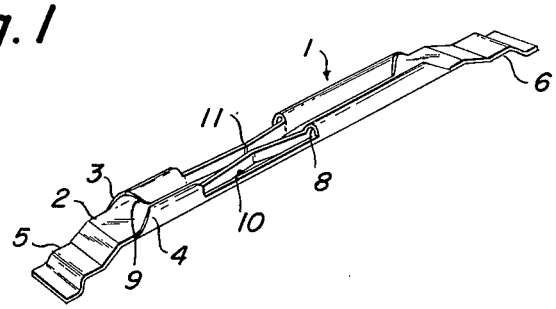
FIG. 1 is a perspective view of one embodiment of my invention.
Figure 2:
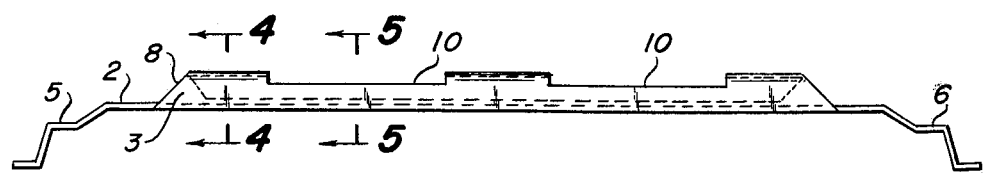
FIG. 2 is a side elevation view of a second embodiment of my invention.

Referring first to FIG. 1, there is depicted a prefered embodiment of the circuit card guide of this invention comprising an elongated channel shaped member indicated generally at 1, the member comprising a base 2 and sidewalls 3 and 4. The base 2 includes end portions 5 and 6 provided with means for attachment to a frame (not shown). The end portions 5 and 6 correspond structurally to my aforementioned U.S. Pat. No. 3,258,650 and form no part of this invention, it being understood that alternative fastening means of known construction may be substituted.

In FIG. 1 each sidewall is a mirror counterpart of the other, hence the description will proceed with a description of one sidewall only. It is, of course, quite feasible to construct a guide with other than mirror counterparts, as by providing one rigid side wall, with only the other wall constructed in accordance with this invention. The sidewall comprises an upstanding portion extending substantially perpendicularly from said base in a direction which, for purposes of description, will be termed upwardly in accordance with the orientation of FIGS. 1, 2, 4 and 5, it being understood that in use the guide is likely to be placed in other orientations.

Figure 4:
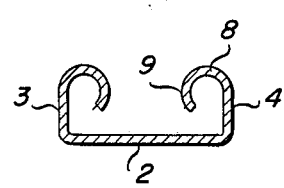
FIG. 4 is a section through IV—IV of FIG. 2.
Figure 5:
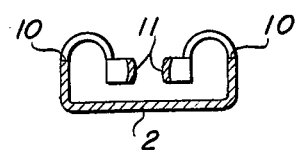
FIG. 5 is a section through V—V of FIG. 2.

The upper reach of the sidewalls 3, 4 extends inwardly over the base 5 in a reentrant bend 8 curving back toward the base to form a downwardly disposed lip 9. The lip 9 curves outwardly of the track toward its respective sidewall 3 or 4 to exhibit a cross-section of slight curvature as seen in FIGS. 4 and 5 for purposes of imparting rigidity thereto and presenting on its convex side a smooth unbroken surface which, with its counterpart of the other sidewall, defines the circuit card track. This configuration extends through a leaf spring structure, about to be described, whereby the smooth, convex surface of said crosssectional configuration constitutes the card engaging surface of the spring. In two preferred embodiments this track is 0.070 or 0.100 inch wide to accomodate, respectively, cards of 0.062 or 0.093 inch thickness, thus providing a slight clearance fit.

To the end that the card may be contacted by resilient gripping structure, the reentrant bend 8 is cut away at at least one portion thereof, leaving an adjacent sidewall portions 10 which is of substantial height in order to preserve the structural integrity of the sidewall throughout the length thereof, thus maintaining rigidity of the channel member as a whole. In an exemplary embodiment, the portion 10 is 83 per cent of the height of the sidewall in portions where the reentrant bend is intact, the height of the portion 10 being 0.100±0.005 inch whereas the height measured from the underside of the base to the top of the reentrant bend is 0.120±0.005 inches. A preferred range includes percentages above 75 per cent. This structure permits a relative rigid track element to be constructed with 0.012 inch thick stainless steel of full spring temper, whereas this material provides the requisite resiliency for gripping elements formed integrally therefrom in a manner now to be described.

Figure 3:
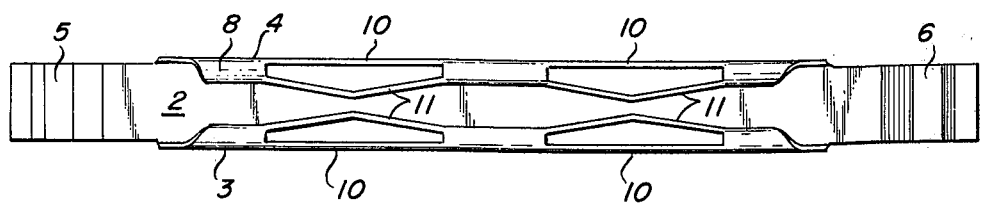
FIG. 3 is a plan view of the embodiment of FIG. 2.

In addition to the sidewall portion 10, the cut away portion of the reentrant bend leaves a contiguous portion 11 of the downwardly disposed lip 9. This portion 11 incorporates the aforedescribed slight curvature in cross-section to impart a limited degree of rigidity thereto, yet the absence of the reentrant bend permits this portion to be sufficiently resilient to be deformed inwardly of the track to form a leaf spring for resilient engagement with a circuit card disposed in said track. Thus is provided a structure which can be completely formed of a single stamping of spring tempered stainless steel, thus attaining the necessary resiliency for the leaf spring structure while providing sufficient rigidity to the channel structure as a whole. This is true whether the structure involves only one such gripper, pairs of opposed grippers (FIG. 1), or a plurality of opposed pairs of grippers (FIGS. 2, 3), and provides considerable versatility in the length of guide that can be provided.

From the foregoing, it can be seen that this invention provides a circuit card guide which may be economically produced from a single stamping of light gauge material, yet which exhibits substantial overall rigidity and provides integral resilient gripping structure with sufficient support to avoid problems of breakage and distortion.

It will be readily apparent to those skilled in the art that many modifications of the specific embodiment disclosed herein may be made without departing from the spirit of the present invention or the scope of the invention as defined in the following claims.

What is claimed is:

1. A circuit card guide comprising an elongated channel-shaped member, the channel being defined in part by a base and by an upstanding sidewall extending substantially perpendicularly from said base, the upper reach of said sidewall remote from said base extending inwardly over said base in a reentrant bend, a downwardly disposed lip extending from said reentrant bend toward and terminating in spaced relationship from said base, said lip defining one side of a track for receiving a circuit card, at least one portion of said reentrant bend being cut away, the portion of said lip which is contiguous to said cut away portion of said reentrant bend being continuous and having a portion displaced inwardly of said track to form a leaf spring having a surface for resilient engagement with a circuit card disposed in said track.

2. A circuit card guide comprising an elongated channel-shaped member, the channel being defined by a base and by upstanding sidewalls extending substantially perpendicularly from either side of said base, the upper reaches of said sidewalls remote from said base extending inwardly toward each other in a reentrant bend, a downwardly disposed lip extending from each said reentrant bend toward and terminating in spaced relationship to said base, the lips of each sidewall being opposed to each other in spaced relationship to define a track for receiving a circuit card between said lips, portions of said reentrant bend being cut away, the portions of at least one said lip which are contiguous to at least one said cut away portion being continuous and having a portion displaced inwardly of said track to form a leaf spring having a surface for resilient engagement with a circuit card disposed in said track.

3. A circuit card as defined in claim 2 wherein said leaf springs of each said sidewall are disposed opposite each other to form a pair of opposed leaf springs for engagement of a circuit card.

4. A circuit card guide as defined in claim 3 including a plurality of said pairs of opposed leaf springs.

5. A circuit card guide as set forth in claim 1 wherein said downwardly disposed lip curves outwardly of said track toward said sidewall thus exhibiting a cross-sectional configuration of curvature, the convex side thereof defining said one side of said track and further defining said surface of said spring for engagement of a circuit card disposed in said track.

6. A circuit card guide as set forth in claim 2 wherein said downwardly disposed lips curve outwardly of said track toward said side walls thus exhibiting a cross-sectional configuration of curvature, the convex sides thereof defining said track and further defining said surfaces of said springs for engagement of a circuit card disposed in said track.

7. A circuit card guide as set forth in claim 2 wherein the height of said portions of said sidewalls adjacent to said cut away portion is at least seventy five percent of the height of the side wall measured from the base to the top of said reentrant bend.

8. A circuit card guide as set forth in claim 2 wherein the guide is formed of a single stamping of spring tempered stainless steel.

* * * * *